(12) United States Patent
Kitagawa et al.

(10) Patent No.: US 10,903,667 B2
(45) Date of Patent: Jan. 26, 2021

(54) BATTERY CONTROL UNIT

(71) Applicant: DENSO CORPORATION, Kariya (JP)

(72) Inventors: Masaaki Kitagawa, Kariya (JP); Masahiko Ito, Kariya (JP); Masakazu Kouda, Kariya (JP); Isao Ishibe, Kariya (JP)

(73) Assignee: DENSO CORPORATION, Kariya (JP)

( * ) Notice: Subject to any disclaimer, the term of this patent is extended or adjusted under 35 U.S.C. 154(b) by 119 days.

(21) Appl. No.: 16/215,388

(22) Filed: Dec. 10, 2018

(65) Prior Publication Data

US 2019/0181658 A1 Jun. 13, 2019

(30) Foreign Application Priority Data

Dec. 8, 2017 (JP) ................................. 2017-236261

(51) Int. Cl.
*G01R 31/396* (2019.01)
*H02J 7/00* (2006.01)
*G01R 31/3835* (2019.01)

(52) U.S. Cl.
CPC ........ *H02J 7/0021* (2013.01); *G01R 31/3835* (2019.01); *G01R 31/396* (2019.01); *H02J 7/0016* (2013.01)

(58) Field of Classification Search
CPC .. H02J 7/0021; H02J 7/0016; G01R 31/3835; G01R 31/396; G01R 31/374
See application file for complete search history.

(56) References Cited

U.S. PATENT DOCUMENTS

| | | | | |
|---|---|---|---|---|
| 2005/0194933 A1* | 9/2005 | Arnold | .................. | H02J 7/0077 320/128 |
| 2014/0159664 A1* | 6/2014 | Yoshida | .............. | H01M 10/441 320/116 |
| 2014/0292345 A1* | 10/2014 | Matumoto | ................ | B60L 3/12 324/434 |
| 2014/0327400 A1* | 11/2014 | Kudo | ...................... | B60L 58/12 320/118 |
| 2015/0035495 A1* | 2/2015 | Yoshida | ................ | H02J 7/0021 320/134 |
| 2015/0301115 A1* | 10/2015 | Ohkawa | ................ | H02J 7/0077 324/429 |
| 2016/0061901 A1* | 3/2016 | Kudo | ................. | G01R 31/3835 324/426 |

(Continued)

*Primary Examiner* — Nha T Nguyen
(74) *Attorney, Agent, or Firm* — Oliff PLC

(57) ABSTRACT

A battery control unit is adapted for a power supply system provided with a storage battery series-connected battery cells, a filter circuit, a discharge circuit, and a connection member connecting between the battery cell and the filter circuit.

The battery control unit includes a voltage detection unit detecting voltage at the battery cell where noise is eliminated by the filter circuit, the voltage being detected immediately before/after a discharging is performed through the discharge circuit; a correction value calculation unit that calculates an amount of a voltage drop at the connection member when a discharging is performed through the discharge circuit, to be a correction value; and a voltage calculation unit that calculates voltage of the battery cell by adding the correction value calculated by the correction value calculation unit to a post-discharge voltage detected immediately after the discharging by the voltage detection unit.

6 Claims, 6 Drawing Sheets

(56) References Cited

U.S. PATENT DOCUMENTS

2016/0172717 A1* 6/2016 Nakatsuka .............. B60L 58/22
                                                              320/112
2016/0276715 A1* 9/2016 Kajitani ................ H02J 7/0047
2019/0067962 A1* 2/2019 Matsubara ............ H02J 7/0026
2019/0339335 A1* 11/2019 Kim ..................... G01R 31/374

* cited by examiner

BATTERY CONTROL UNIT

CROSS-REFERENCE TO RELATED APPLICATION

This application is based on and claims the benefit of priority from earlier Japanese Patent Application No. 2017-236261 filed Dec. 8, 2017, the description of which is incorporated herein by reference.

BACKGROUND

Technical Field

The present disclosure relates to a battery control unit.

Description of the Related Art

A power supply system provided with a storage battery in which a plurality of battery cells are connected in series includes a voltage detection circuit for detecting voltages of the battery cells, an equalization circuit for equalizing the voltages of the battery cells detected by the voltage detection circuit. A low pass filter is provided between the voltage detection circuit and each battery cell so as to eliminate noise included in the voltage transmitted to the voltage detection circuit from each battery cell. By measuring the capacitor voltage of the low pass filter circuit, the voltage of each battery cell is detected. However, when discharge is performed from the respective battery cells through the equalization circuit, a contact resistance or the like included in a path between the battery cell and the low pass filter circuit generates a voltage drop and discharging is performed from the capacitor. Hence, this is one of causes of the detection error when the voltage detection circuit detects voltages. In this respect, for example, patent literature, i.e. JP-A-2014-196951 discloses a technique of using a voltage correction circuit in which the detection voltage is corrected based on an equation defined in a design phase, in accordance with a period from a time when the discharging by the equalization circuit is completed to a time when the voltage is detected by the voltage detection circuit.

Here, a contact resistance included in a path between a battery cell and a filter circuit or an internal resistance included in a conductor of the path varies due to aging degradation and so on. However, according to a technique disclosed by the above-mentioned patent literature, since a correction value is determined in the design phase, a change in the resistance value over time cannot be considered. Recently, the required frequency range of noise to be eliminated (i.e. cutoff frequency) has been becoming more strict so that the time constant of the low pass filter becomes larger. Therefore, according to a correction technique disclosed in the above-mentioned patent literature, errors in the detected voltage become large. In this respect, detection accuracy of the voltage is required to be higher even if the time constant of the low pass filter is larger. In order to remove errors caused by voltage change in the capacitor during the discharge operation, it is considered that voltage detection may be delayed until influence of the discharging on the capacitor disappears. However, if the time constant of the low pass filter is large, it takes time until the influence of the discharging on the capacitor disappears.

SUMMARY

The present disclosure has been achieved in light of the above-described circumstances and provides a battery control apparatus capable of accurately and promptly detecting voltage of battery cells.

As a first aspect, a battery control unit (20) is adapted for a power supply system provided with a storage battery (10) in which a plurality of battery cells (C) are connected in series, a filter circuit (31) provided for each of the battery cells, including a capacitor (33) and eliminating noise included in voltage transmitted from the battery cell, a connection member (L) that connects between the battery cell and the filter circuit, a discharge circuit (34) including a discharge switch (22) provided for each of the battery cells and connected in series to the battery cell via the connection member and a discharge resistor (35). The battery control unit includes: a voltage detection unit (21) provided for each of the battery cells, detecting voltage at the battery cell where noise is eliminated by the filter circuit, the voltage being detected immediately before/after discharging is performed through the discharge circuit; a correction value calculation unit that calculates, while the power supply system is being operated, an amount of a voltage drop at the connection member when discharging is performed through the discharge circuit, to be a correction value; and a voltage calculation unit that calculates voltage of the battery cell by adding the correction value calculated by the correction value calculation unit to a post-discharge voltage detected by the voltage detection unit, the post-discharge voltage being voltage detected immediately after the discharging.

A contact resistance or an internal resistance included in a connection member between a battery cell and a filter circuit varies due to aging degradation and so on. Hence, when current flows through the discharge circuit for discharging the battery cell, since the capacitor voltage varies because of a voltage drop at the resistance of the connection member, voltage detected at a voltage detection unit after eliminating noise by the filter circuit differs from the battery cell voltage. This is the cause of error included in the voltage detected at the voltage detection unit. Further, since the resistance changes over time due to aging or the like, it is difficult to calculate in advance a difference between the capacitor voltage at the capacitor after discharging and the battery cell voltage, that is, an amount of voltage drop at the connection member.

According to the first aspect, the correction value calculation unit calculates an amount of voltage drop at the connection member when discharging the battery cell through the discharge circuit, during operation of the power supply system, to be the correction value. Then, the correction value is added to a post-discharge voltage, whereby the voltage calculation unit calculates the battery cell voltage. Thus, an amount of voltage drop is calculated at the connection member when current is actually flowing through the discharge circuit, and the amount of voltage drop is determined as the correction value. Hence, accurate correction can be made depending on the situation. Moreover, because the battery cell voltage is calculated using the correction value, it is not necessary to wait until the capacitor voltage reaches the battery cell voltage so that voltage at the battery cell can be promptly calculated.

As a second aspect, the battery control unit includes an initial correction value calculation unit that calculates an initial correction value when the power supply system is activated and when discharging has been performed for all of the battery cells through the discharge circuit, the initial correction value being calculated by comparing voltage detected at a previous or next detection timing of the post-discharge voltage detected by the voltage detection unit, with the post-discharge voltage; and the correction value calculating unit is configured to correct, during operation of the power supply system, the initial correction value calculated by the initial correction value calculation unit to be the correction value, depending on state of the battery cell when being discharged through the discharge circuit.

When the power supply system is activated, the process performs discharging for all of the battery cells through the discharge circuit, in order to validate the discharge circuit or the like. Immediately after the discharging is performed in the activation of the power supply system, the initial correction value is calculated by comparing voltage detected at a previous or next detection timing of the post-discharge voltage detected by the voltage detection unit, with the post-discharge voltage. Then, the correction value calculating unit corrects, during the power supply system being operated, the initial correction value to be the correction value, depending on state of the battery cell when being discharged through the discharge circuit. The post-discharge voltage can be corrected with this correction value depending on the state of the battery cell and more accurate voltage value of the battery cell can be calculated.

As a third aspect, the correction value calculation unit is configured to correct the initial correction value to be a correction value based on a ratio between a pre-discharge voltage of the battery cell detected by the voltage detection unit when the initial correction value calculation unit calculates the initial correction value and the pre-discharge voltage of the battery cell detected by the voltage detection unit immediately before discharging is performed through the discharge circuit while the power supply system is being operated.

Since the amount of current flowing through the discharge circuit is proportional to the voltage immediately before the battery cell discharges through the discharge circuit, the voltage drop at the connection member is proportional to the voltage immediately before the battery cell discharges through the discharge circuit and the voltage difference between voltages of the capacitor and the battery cell is also proportional to the voltage immediately before discharging. In this respect, while the power supply system is being operated, in order to calculate the correction value in accordance with a voltage drop when discharging through the discharge circuit, the correction value calculation unit corrects the initial correction value to be a correction value based on a ratio between the pre-discharge voltage of the battery cell used for calculating the initial correction value and the pre-discharge voltage immediately before discharging through the discharge circuit. Thus, since the initial correction value is corrected, accurate correction can be made even when the voltage of the battery cell varies.

As a fourth aspect, the correction value calculation unit is configured to correct the correction value to be the correction value such that the initial correction value of one battery cell is multiplied by the pre-discharge voltage immediately before discharging one battery cell, and the multiplied initial correction value is divided by the pre-discharge voltage at a time when calculating the correction value of one battery cell, thereby correcting the correction value.

With one battery cell, when discharging through the discharge circuit, the initial correction value is corrected using a ratio between the pre-discharge voltage and voltage after discharging. Specifically, the initial correction value of one battery cell is multiplied by a pre-discharge voltage of the one battery cell, and the multiplied value is divided by the pre-discharge voltage at a time when the initial correction voltage is calculated, thereby correcting the initial correction value to be the correction value. Thus, the correction value is calculated, whereby accurate correction can be made.

As a fifth aspect, the connection member is shared by battery cells adjacently located to each other;

the correction calculation unit is configured to correct the initial correction value to be the correction value when the one battery cell does not discharge but the battery cell located adjacently to one side of the one battery cell discharges, such that a value where the initial correction value of the one battery cell is multiplied by a pre-discharge voltage immediately before discharging the adjacent battery cell is divided by a pre-discharge voltage at a time when the initial correction value of the adjacent battery cell is to be discharged, and the divided value is halved to produce a negative value, thereby correcting the initial correction value to be the correction value.

When it is assumed that one battery cell is not discharging and the connection member is shared by an adjacent battery cell, and an adjacent battery cell located adjacently at one side of the one battery cell is discharging through the discharge circuit, a voltage drop is produced in the shared connection member. As a result, voltage at the capacitor connected to the one battery cell increases relative to the battery cell by an amount of the voltage drop. The voltage drop at the shared connection member varies depending on voltage at the adjacent battery cell so that the voltage at the capacitor which is connected to the one battery cell also varies. In this regard, the initial correction value of the one battery cell is corrected, based on a ratio between the pre-discharge voltage at the adjacent battery cell and the pre-discharge voltage when calculating the initial correction value, to acquire the correction value. Since an amount of the voltage drop at the connection member is only an amount corresponding to one side where the discharging is performed, the correction value becomes half the amount of the initial correction value when discharged in the both sides, and the voltage at the capacitor is higher than the voltage of the one battery cell, it is required to subtract an amount of the correction value from the amount of the voltage drop. Specifically, a value where the initial correction value of the one battery cell is multiplied by the pre-discharge voltage of the adjacent battery cell, is divided by the pre-discharge voltage when calculating the initial correction value of the adjacent battery cell, and then the divided value is halved to be negative value, whereby the initial correction value of the battery cell is corrected to be the correction value. Thus, the initial correction value is corrected, whereby accurate correction can be performed.

As a sixth aspect, the connection member is shared by battery cells adjacently located to each other; the correction calculation unit is configured to correct the initial correction value to be the correction value when the one battery cell does not discharge but both battery cells located adjacently to both sides of the one battery cell discharge, such that a value where the initial correction value of the one battery cell is multiplied by a pre-discharge voltage immediately before discharging the adjacent battery cell of one side is divided by a pre-discharge voltage at a time when the initial correction value of the adjacent battery cell of the one side is calculated and the divided value is halved to be a first value, and a value where the initial correction value of the one battery cell is multiplied by a pre-discharge voltage immediately before discharging the adjacent battery cell of the other side is divided by a pre-discharge voltage at a time when the initial correction value of the adjacent battery cell of the other side and the divided value is halved to be a second value, the first value and the second value are added to produce a negative value, thereby correcting the initial correction value to be the correction value.

When it is assumed that one battery cell is not discharging and the connection member is shared by an adjacent battery cell, and adjacent battery cells located adjacently at both sides of the one battery cell are discharging through respective discharge circuits, the initial correction value of the one battery cell is corrected to acquire the correction value by using a ratio between the pre-discharge voltage and the pre-discharge voltage when calculating the initial correction value, in each of the adjacent battery cells. Specifically, the initial correction value of the one battery cell is multiplied by the pre-discharge voltage of an adjacent battery cell located adjacently to the one battery cell in one side, the multiplied value is divided by the pre-discharge voltage when calculating the initial correction value of the adjacent battery cell in the one side, and the divided value is halved (one halved value). Also, the initial correction value of the one battery cell is multiplied by the pre-discharge voltage of an adjacent battery cell located adjacently to the one battery cell in the other side, the multiplied value is divided by the pre-discharge voltage when calculating the initial correction value of the adjacent battery cell in the other side, and the divided value is halved (the other halved value). Then, one halved value and the other halved value are summed to produce a negative value, whereby the initial correction value of one battery cell is corrected to obtain the correction value. Thus, the initial correction value is corrected, whereby accurate correction can be performed.

As a seventh aspect, the correction value calculation unit includes a temperature measuring unit that measures the temperature of the battery cells; and the correction calculation unit is configured to correct the initial correction value to be a correction value based on a difference between a temperature measured by the temperature measuring unit at a time when the initial correction value is corrected and a temperature measured by the temperature measuring unit at a time when discharging is performed through the discharge circuit when the power supply system is being operated.

The internal resistance of the connection member varies depending on the temperature of the battery cell immediately before discharging through the discharge circuit. Hence, the voltage drop at the connection member varies depending on the temperature of the battery cell immediately before discharging through the discharge circuit, and an amount of discharge from the capacitor also varies. In this respect, while the power supply system is being operated, in order to calculate the correction value based on the voltage drop when discharging through the discharge circuit, the initial correction value is corrected, based on a difference between the initial temperature of the battery cell used for calculating the initial correction value and the temperature when discharging through the discharge circuit, and the corrected initial correction value is regarded as the correction value. Thus, the initial correction value is corrected, whereby accurate correction can be performed even when the temperature of the battery cell varies.

BRIEF DESCRIPTION OF THE DRAWINGS

In the accompanying drawings.

DETAILED DESCRIPTION OF THE PREFERRED EMBODIMENTS

With reference to drawings, embodiments of a battery control unit according to the present disclosure will be described. The battery control unit according to the present disclosure is adapted for power supply systems mounted on hybrid vehicles or electric vehicles, for example.

Figure 1:
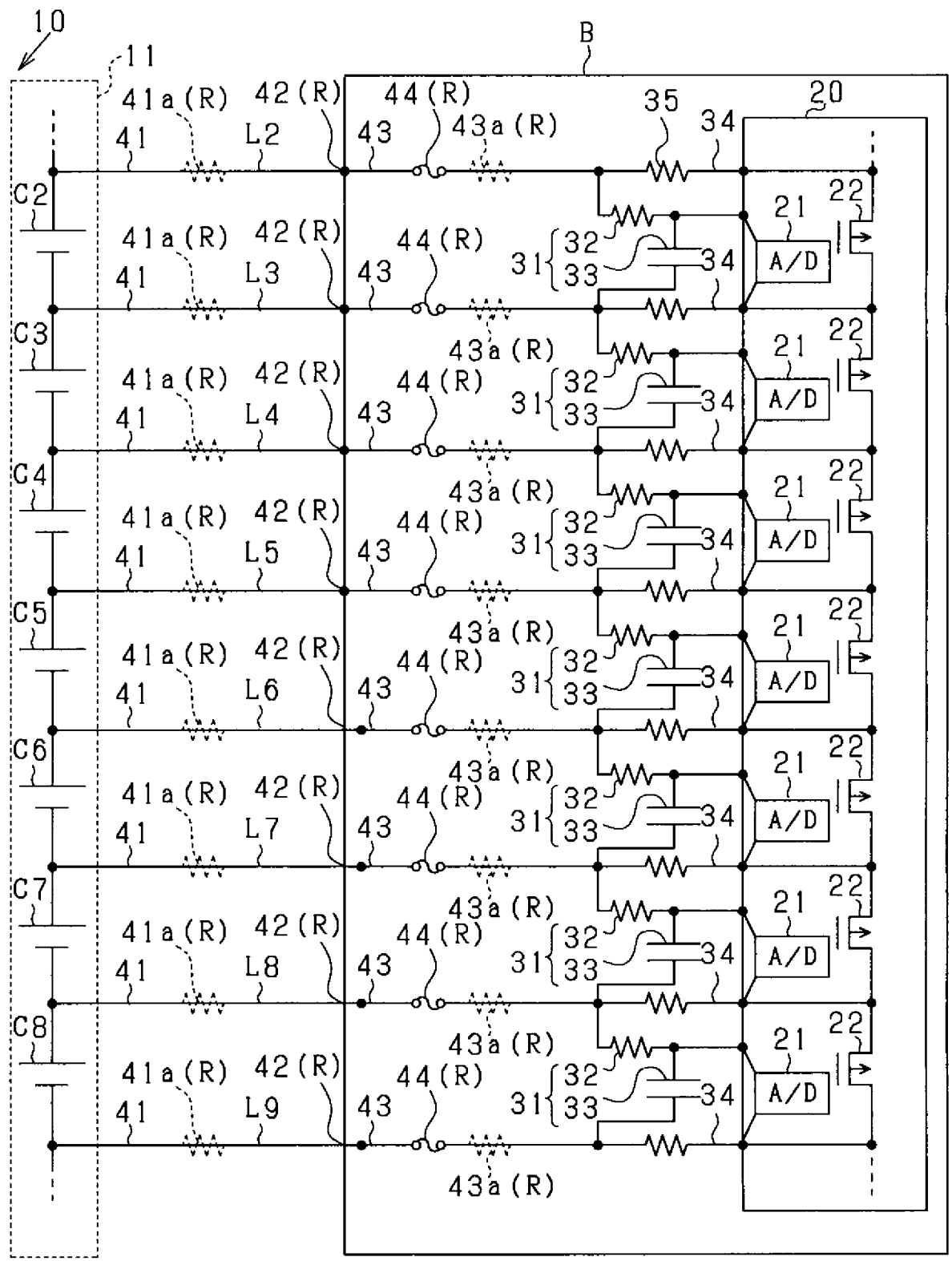
FIG. 1 is a block diagram showing an overall configuration of a power supply system according to a first embodiment of the pre sent disclosure.

As shown in FIG. 1, the power supply system is provided with a storage battery 10. The storage battery 10 is configured of, for example, a lithium ion battery serving as a power source for on-vehicle electrical load including a traction motor (not shown) of a vehicle. Note that it is not limited to lithium ion batteries, but other types of batteries such as nickel hydride batteries may be used as long as a storage battery composed of a plurality of battery cells which supplies a predetermined voltage is used.

The storage battery 10 is composed of a battery module 11 including n battery cells C1-Cn connected in series, where n is an integer one or more, approximately several to several tens. The storage battery 10 may be configured of a plurality of battery modules 11 connected in series or connected in parallel, or may be configured of a single battery module 11. According to the present embodiment, one battery module 11 is exemplified as a storage battery 10. In the following description, battery cells C1 to Cn are also referred to as a battery cell C. In FIG. 1, descriptions for the battery cell C1, C9 and subsequent battery cells are omitted.

A supervisory IC (integrated circuit) 20 is provided for each battery module 11, to supervise a state of the battery while performing a calculation of voltages corresponding to each of the battery cell C, an equalization process and the like. The supervisory IC includes, for each battery cell C, a voltage detection circuit 21 and a discharge switch 22. Also, the supervisory IC 20 includes a control unit (not shown) that calculates the voltage of each battery cell C and controls the discharge switch 22, and a memory unit that stores data and the like. According to the present embodiment, the supervisory IC 20 corresponds to a battery control unit, the voltage detection circuit 21 corresponds to a voltage detection unit. The supervisory IC 20 may supervise a plurality of battery modules 11 or single battery module 11 may be supervised by a plurality of battery modules 20. The control unit and the memory unit may not be provided in the supervisory IC but may be provided in an ECU (electronic control unit) communicable with the supervisory IC 20.

For each battery cell C, the voltage detection circuit 21, a filter circuit 31 and a discharge circuit 34 are provided. Connection members L1 to L (n+1) are provided to connect between the battery cell C, the filter circuit 31 and the discharge circuit 34. Each of the connection members L1 to L (n+1) connects the positive terminal of each battery cell C and one end of the filter circuit, and connects the negative terminal of each battery cell C to the other end of the filter circuit 31. Further, connection members L2 to Ln, other than the connection member L1 connected to the positive terminal of the highest voltage side battery cell C1 and the connection members L (n+1) connected to the negative terminal of the lowest voltage side battery cell Cn, are shared by adjacent battery cells C. For example, the connection member L3 that connects the positive terminal of the battery cell C3 and the one end of the filter circuit 31 serves as the connection member L3 that connects the negative terminal of the battery cell C2 and the other end of the adjacent filter circuit 31. In the following description, the connection members L1 to L (n+1) are also referred to as a connection member L. In FIG. 1, descriptions for the connection member L1, the connection member L10 and subsequent connection members are omitted.

The substrate B is provided with the supervisory IC 20, the filter circuit 31, the discharge circuit 34 and the like. A wire harness 41 is provided to connect the substrate B and the battery cell C. Further, the wire harness 41 and the substrate B are connected via a connector 42 therebetween. Also, the substrate B includes a printed wiring 43 and a fuse 44. The connection member L includes the above-described components (i.e. the wire harness 41, the connector 42, the printed wiring 43 and the fuse 44), and connects the battery cells C and the filter circuits 31. The wire harness 41 includes a resistive component 41a serving as a resistor, and the printed wiring 43 includes a resistive component 43a serving as a resistor. The connector 42 has a contact resistance and components such as a fuse mounted on the printed wiring 43 or components connected to the printed wiring 43 owns resistive component and a contact resistance. These resistive components are defined as an internal resistance R. The resistance value of internal resistance R varies depending on aging degradation and ambient temperature. The resistance value is approximately several hundreds of milli ohms.

The filter circuit 31 eliminates noise contained in the voltage transmitted to the voltage detection circuit 21 of the supervisory circuit from the battery cell C or noise propagated to the power supply system from external circuit. The filter circuit 31 is configured as a low pass filter which is a so called RC circuit, including a filter resistor 32 and a capacitor 33. The filter resistor 32 has approximately several kilo ohm. On the other hand, the capacitor 33 has a capacitance of approximately 33 μF. The one end of the filter resistance 32 is connected to the connection member L of the positive electrode side, and the other end of the filter resistance 32 is connected to a pin of the supervisory IC 20 connected to the voltage detection circuit 21. The one end of the capacitor 33 is connected between the other end of the filter resistor 32 and the voltage detection circuit 21, and the other end of the capacitor 33 is connected to the connection member L of the negative electrode side. Note that the filter circuit 31 may be any other filter circuits as long as a capacitor is used, such as a low pass filter using an inductor instead of the filter resistor 32.

The discharge circuit 34 is a discharge circuit configured to equalize respective battery cells C (cell balance processing).

The discharge circuit 34 is connected in parallel to the filter circuit 31 with respect to the battery cell C. The discharge circuit 34 is provided with a discharge switch 22 included in the supervisory IC 20 and a discharge resistor 35. The resistance of the discharge resistor 35 is approximately several tens of ohms. For the discharge resistor 35, one end is connected to the connection member L together with the filter circuit 31, and the other end is connected to a pin of the supervisory IC 20 connected to the discharge switch 22.

Similar to the connection member L, the discharge resistor 35 is shared between adjacent battery cells C.

Figure 2:
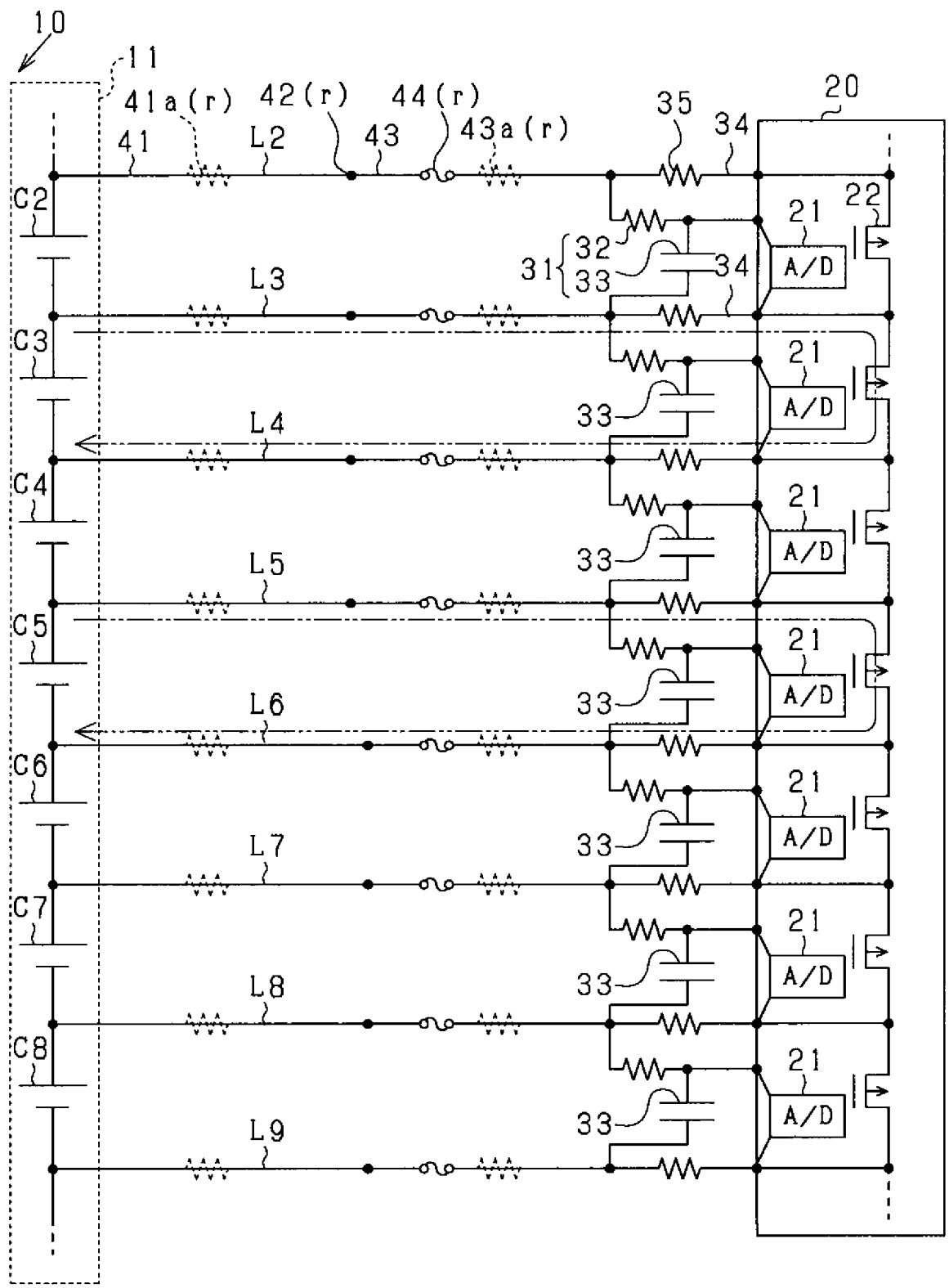
FIG. 2 is a diagram showing a state where current is flowing through discharge circuits to equalize cell voltages.

When current flows through the discharge circuit 34, as shown in an arrow in FIG. 2, the current flows through the discharge resistor 35 in the positive electrode side from the positive electrode of the battery cell C via the connection member L of the positive electrode side, and flows through the discharge resistor 35 in the negative electrode side via the connection member L in the negative electrode side, and then the current returns to the negative electrode side of the battery cell C. Specifically, the control unit determines whether discharging from the battery cell C through this current path is performed or not, by using the discharge switch 22 disposed in the supervisory IC 20 between the positive electrode side discharge resistor 35 and the negative electrode side discharge resistor 35. The discharging of the battery cell C is performed for divided battery cell groups at different discharge timing for each battery cell group. Specifically, the battery cell C is divided into an odd number of battery cell groups and an even number of battery cell groups and the control unit controls the discharge switch to discharge respective battery cell groups at mutually different discharge timings. Note that the discharging of the battery cell C may be performed such that adjacent battery cells C are discharged at different discharge timings. Accordingly, the battery cell C may be divided into 3 groups for discharging, or the battery cell C may not be divided into groups for discharging.

The voltage detection circuit 21 is configured of an A/D conversion unit and detects voltage of the capacitor 33. The one end of the voltage detection circuit 21 is connected to the filter resistor 32, and the other end is connected to the discharge resistor 35. Since each voltage of the capacitors 33 in steady state corresponds to each voltage of the respective battery cells C connected in parallel, the respective voltage detection circuits 21 measures each voltage of the capacitors 33, whereby each voltage of the battery cell C can be measured in a state where the noise is eliminated by filter circuits 31.

However, when discharge current flows through the discharge circuit 34, voltage drop occurs with the internal resistance R of the connection member L so that the voltage of the capacitor 33 differs from the voltage of the battery cell C. Hence, to calculate the voltage of the battery cell C, the voltage of the capacitor 33 detected by the voltage detection circuit 21 is required to be corrected.

Figure 3:
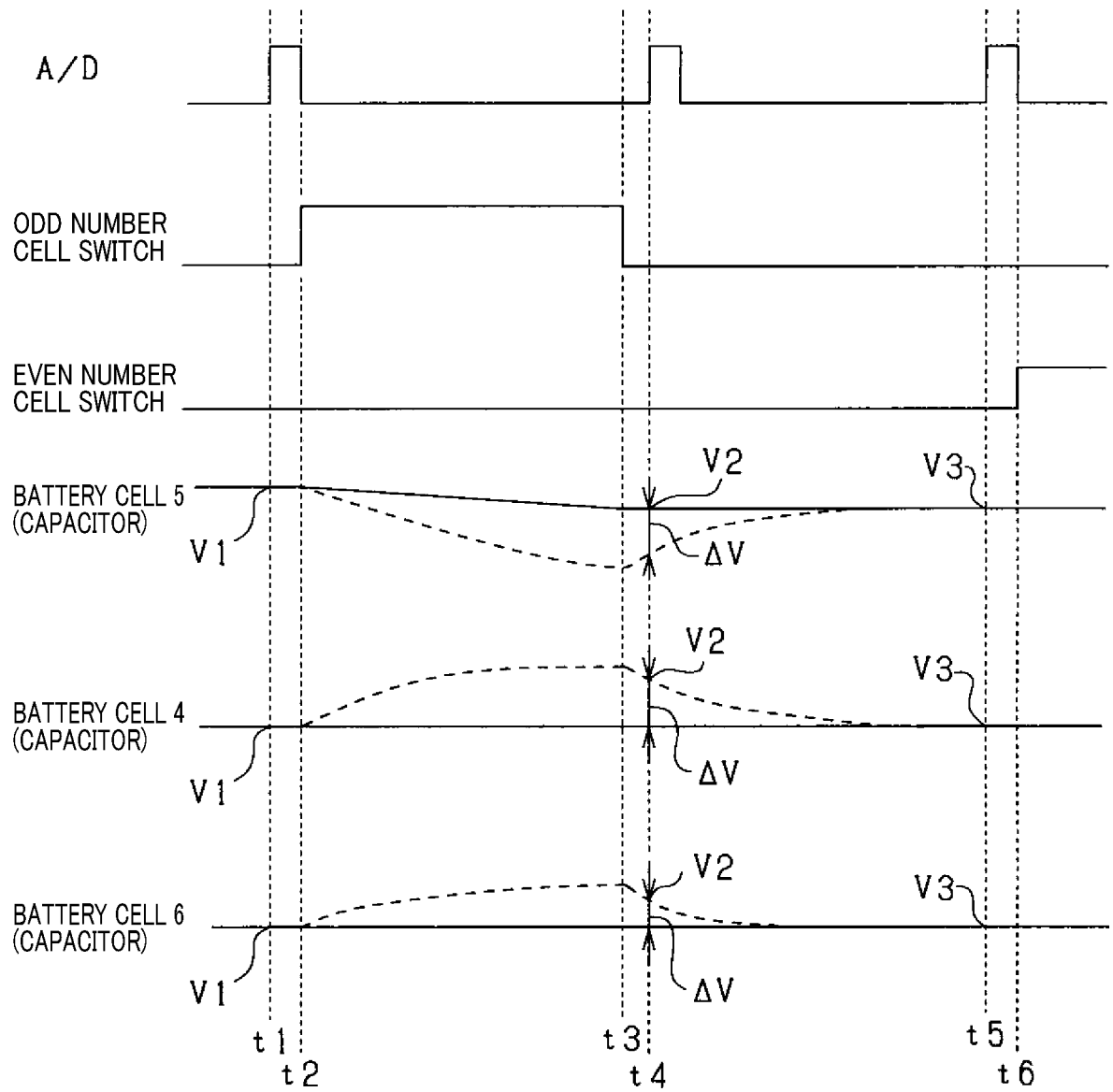
FIG. 3 is a timing diagram showing a change in the cell voltages at voltage detection circuits.
Figure 4:
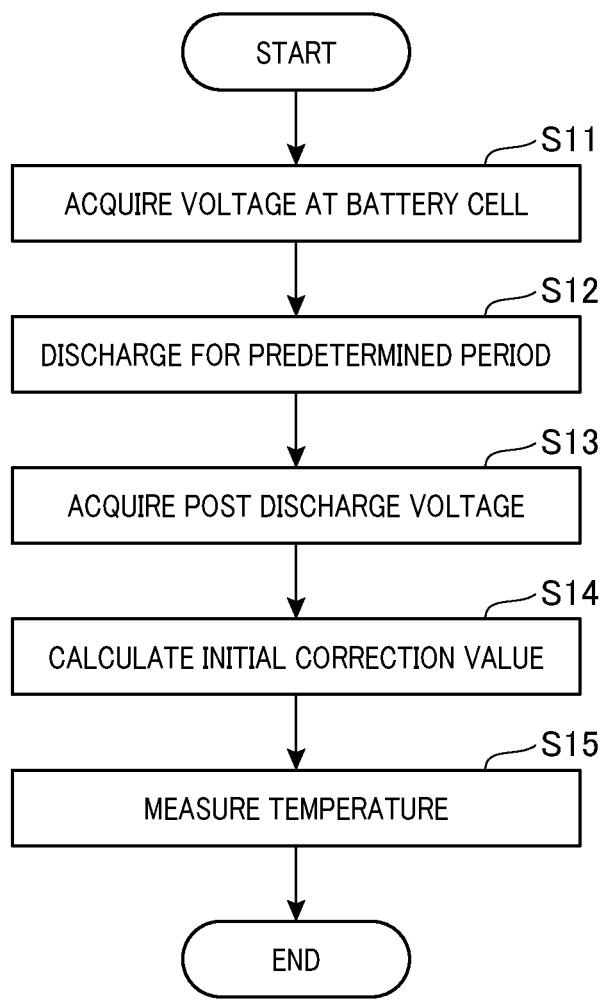
FIG. 4 is a flowchart showing a process executed in the battery control unit when activating the power supply system.
Figure 5:
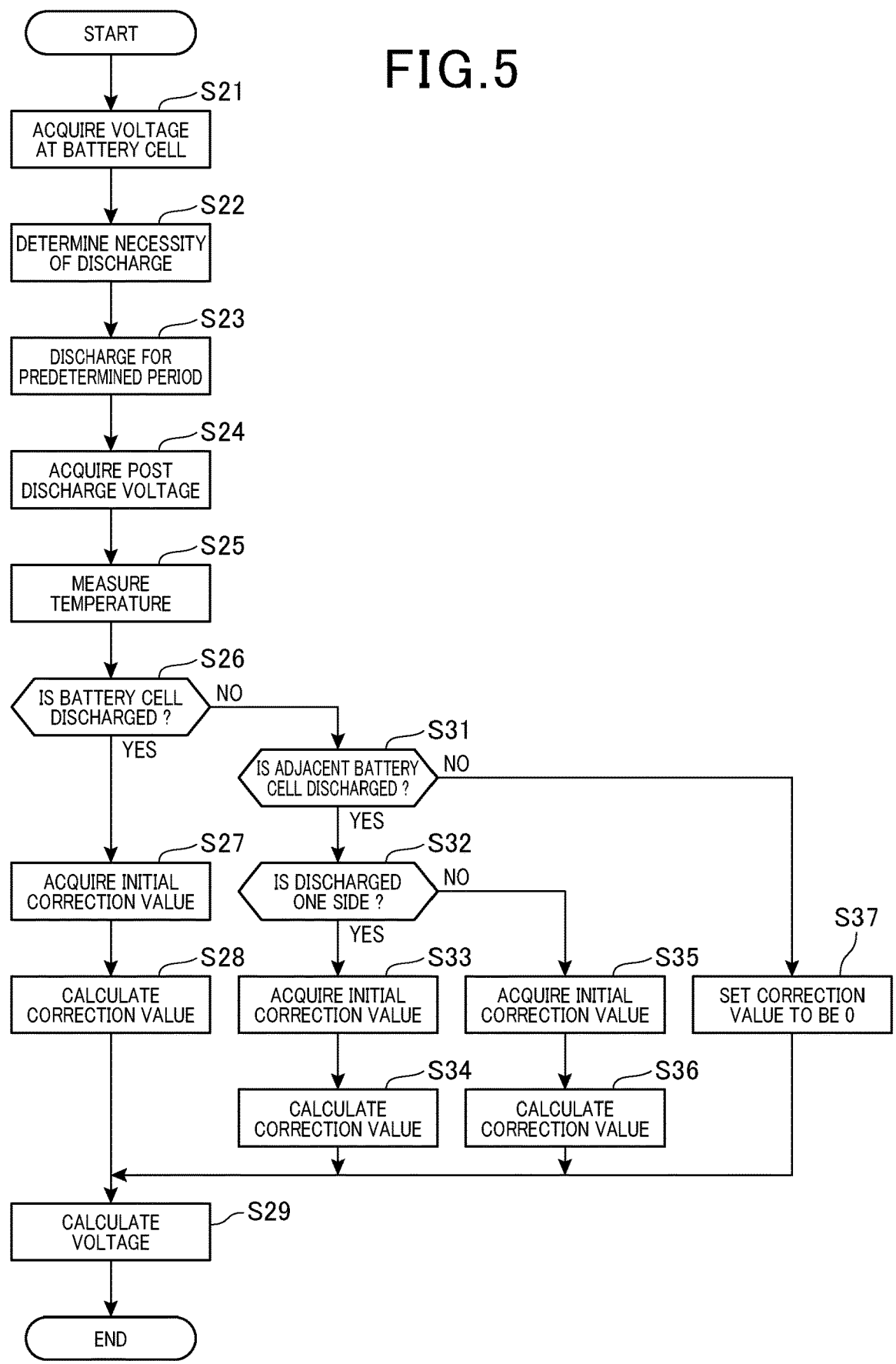
FIG. 5 is a flowchart showing a process executed in the battery control unit for calculating a correction value during the power supply system in operation.
Figure 6:
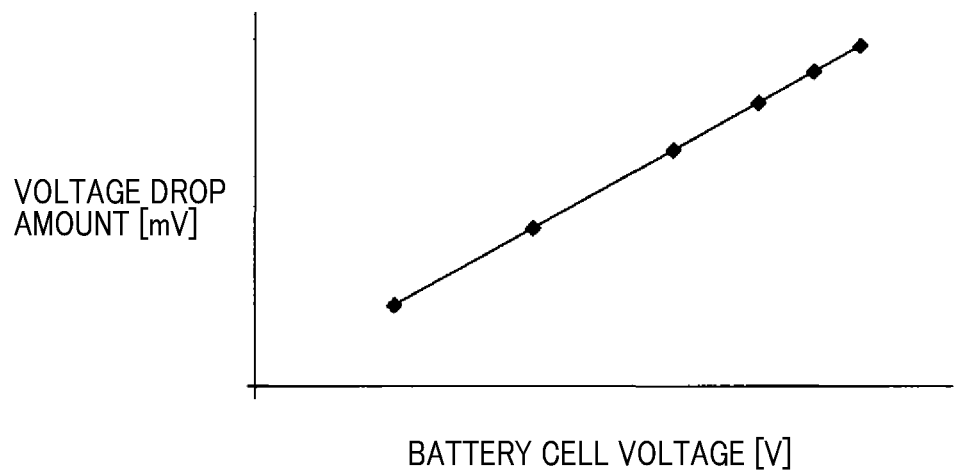
FIG. 6 is a graph showing a relationship between a cell voltage and a voltage drop at a connection member.
Figure 7:
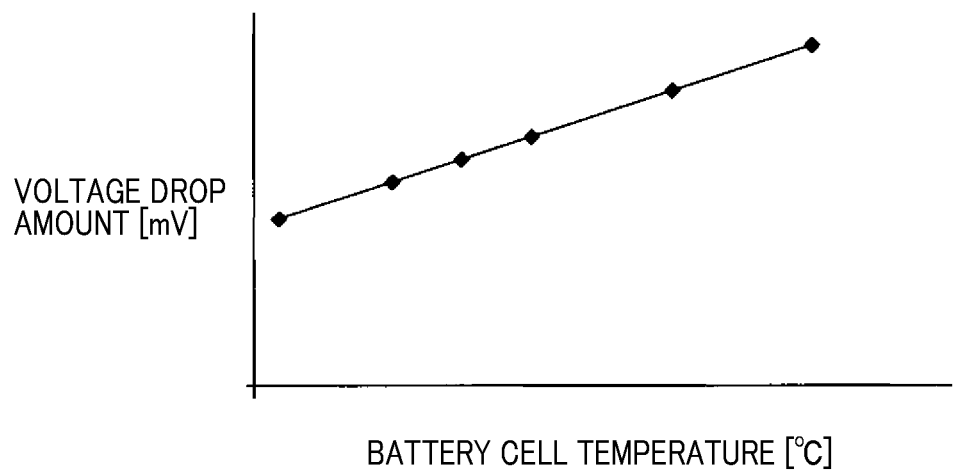
FIG. 7 is a graph showing a relationship between the temperature of the battery cell and the voltage drop at the connection member.

Hereinafter, with reference to FIGS. 2 to 7, a correction method will be described in detail. FIG. 2 illustrates a state where the battery cells C3 and C5 are discharged during the power supply system being operated. FIG. 3 illustrates the voltage of the battery cell C and the voltage of the capacitor 33 (indicated by dotted line) when discharged (a case illustrated by FIG. 2 or the like). In FIG. 3, the horizontal line indicates the time, and the vertical line indicates a signal level of each signal. FIG. 4 is a flowchart showing a process executed when the power supply system is activated. FIG. 5 is a flowchart showing a process executed for calculating a correction value while the power supply system is being operated. FIG. 6 is a graph showing a relationship between the voltage of the battery cell C and the voltage drop at the connection member L, and FIG. 7 is a graph showing a relationship between the temperature of the battery cell C and the voltage drop at the connection member L.

The control unit (supervisory IC 20) executes the process of the flowchart shown in FIG. 4 when the power supply system is activated. When IG (ignition) signal of the vehicle turns ON to activate the power supply system, the process acquires, at step S11, the initial voltage Vi used for calculating the initial correction values S of all of the battery cells C. Specifically, the process controls the voltage detection circuit 21 for respective battery cell C to detect the voltage of the capacitor 33, thereby acquiring the voltage detected by the voltage detection circuit 21.

At step S12, the process controls the discharge switch 22 to be ON state (closed state) in order to discharge the battery cell C through the discharge circuit 34 in the odd numbered group of battery cell C or the even numbered group of battery cell C. Then, when a predetermined period (e.g. 10 and several milliseconds) elapses after the discharge switch is turned ON, the process controls the discharge switch 22 to the OFF state (closed state) and terminates discharging.

When the discharging is terminated, at step S13, the process acquires a post discharge voltage V0 used for calculating the initial correction value, as a voltage immediately after the discharging. Specifically, similar to step S11, for all of the battery cells C, the voltage detection circuit 21 detects the voltage of the capacitor 33 to acquire the detected voltage. Note that the voltage immediately after the discharge refers to a voltage detected within a time when approximately several milliseconds has elapsed after the discharge switch 22 is turned OFF. Since it is possible that the current is still flowing through the discharge circuit 34 immediately after the OFF command of the discharge switch 22 is issued, a period for handling transients (e.g. 1 to 3 milliseconds) is set between step S12 and step S13.

Next, at step S14, the process calculates the initial correction value S of the battery cell C which has been discharged. The process calculates a voltage difference between the initial voltage Vi detected at a detection timing which is previous detection timing of the detection timing at which the post discharge voltage V0 is detected, and the post discharge voltage Vo acquired at step S13. This voltage difference is defined as the initial correction value S. This difference includes a voltage drop produced at the battery cell C by discharging through the discharge circuit 34. However, since the discharge time is short and the difference ΔV0 between the post discharge voltage V0 and the real value of the battery cell C is larger than the voltage drop, the voltage drop can be ignored. According to the present disclosure, a difference between the initial voltage Vi detected at previous detection timing of the detection timing of the post discharge voltage, and the post discharge voltage is acquired. However, the process may acquire a difference between a voltage acquired at a detection timing next to the detection timing at which the post discharge voltage V0 is detected and the initial voltage Vi. Thus, the initial correction value S of the battery cell C is calculated for the odd numbered group of battery cell C or the even numbered group of battery cell C.

While calculating the initial correction value S at step S14, at step S15, the process measures the initial temperature Ti of the battery cell C at a time of calculating the initial correction value. Note that step S14 and step S15 may be executed simultaneously or may be executed sequentially. When processes of the steps S14 and S15 are ended, the process terminates the procedure. When the process determines there remain battery cells C in which the initial correction value S has not been calculated, the processes are repeatedly executed. In other words, when the processes are executed for the odd numbered group of the battery cell C, the processes are subsequently executed for the even numbered group of the battery cell C.

For processes shown in the flowchart, only a calculation process of the initial correction value S when activating the power supply system is described. However, the processes include an initial check routine which, for example, notifies of abnormality when an abnormality is detected during a discharge process with the discharge circuit 34, a voltage detection process at the voltage detection circuit 21 and a temperature measuring process for the battery cell C. In the flowchart, the function of step S14 corresponds to the initial correction value calculation unit, and the function of step S15 corresponds to temperature measuring unit. The function of temperature measuring unit may be performed for both of the odd numbered group and the even number of the battery cell C, or may be performed for either one group.

Next, a method for calculating the voltage of the battery cell C using a correction value ΔV will be described.

First, with reference to FIG. 3, errors occurring in the detection result of the voltage detection circuit and the voltage of the battery cell C, while the power supply system is operating will be described. At timing t1, a pre-discharge voltage V1 is detected at the voltage detection circuit 31 for each battery cell C. When detection at the voltage detection circuit 21 is ended, at timing t2, the discharge switch 22 of the battery cell C corresponding to odd numbered group which will be discharged is turned ON (closed) to start discharging.

During discharging, by discharging through the discharge circuit 34, the voltage at the capacitor 33 varies in response to the voltage drop due to the internal resistance R in the connection member L. Specifically, a case will be described in which the battery cell C3 and the battery cell C5 are discharged as shown in FIG. 2. The voltage at the capacitor 33 relative to the battery cell C5 which is discharging decreases because of voltage drop at the internal resistance R in the connection member L5 and the connection member L6. The voltage at the capacitor 33 relative to the battery cell C6 of which the adjacent cell (i.e. battery cell C5) is discharging increases because of voltage drop at the internal resistance in the connection member L6. For the capacitor 33 relative to the battery cell C4 of which the adjacent two battery cells (i.e. battery cells C3 and C5) are discharging, the voltage at the capacitor 33 increases because of voltage drop at the internal resistance R in the connection members L4 and L5.

After discharging for a predetermined period (e.g. ten to twenty milliseconds), the discharge switch 22 is turned OFF (open) at timing t3. Then, after the discharge switch 22 is turned OFF and a transient period elapses for which the current completely stops flowing, and at t4, the process detects the post voltage V2 at the voltage detection circuit 21.

Then, after a predetermined OFF period (e.g. ten to twenty milliseconds) elapses, even numbered group of battery cell C is discharged. At timing t5, the voltage detection circuit 21 detects the pre-discharge voltage V3 for each of the battery cell C. At timing t6, the discharge switch 22 of even group number of the battery cell C is turned ON (closed) to start discharging. Hereinafter, since the procedure of odd numbered group of the battery cell C is similar to that of the even numbered groups, explanation will be omitted. Thus, even numbered group of battery cell C and odd numbered group of battery cell C are alternately discharged.

In the case where error occurs shown in FIG. 3, the correction value ΔV is required to be calculated so as to calculate the voltage of the battery cell C. FIG. 5 is a flowchart showing a correction value calculation process executed by the control unit (supervisory IC20). The correction value calculation process is repeatedly executed at a predetermined period by the control unit. Hereinafter, as an example, as shown in FIG. 2, a case where odd numbered group of battery cell C is discharged will be described. Specifically, a case where the battery cells C3 and C5 are discharged will be described.

At step S21, the process acquires the pre-discharge voltage V1 of all of the battery cells C. Specifically, the process controls the voltage detection circuit 21 of all of the battery cells C to acquire the voltage at the capacitor 33, thereby acquiring the detected voltage detected at the voltage detection circuit 21.

At step S22, the process determines if discharging of respective battery cells C is necessary in the odd numbered group of battery cell C or the even numbered group of battery cell C. Specifically, when voltage at one battery cell is larger than voltage at another battery cells, the process determines that it is necessary to discharge the one battery cell C. Note that this step is not necessarily executed every period, but is executed at a time when a certain number of periods of discharging is completed or a time when a predetermined period elapses after the previous step was executed.

Then, the process controls the discharge switch 22 to be ON (closed) at step S23 to discharge the battery cell C through the discharge circuit 34, where the battery cell C is determined at step S22 that discharging is necessary. Then, when a certain period (e.g. ten to twenty milliseconds) is elapsed after the discharge switch 22 is turned ON, the process controls the discharge switch 22 to be OFF and terminates the discharging. Specifically, the process determines that discharging is necessary for the battery cell C3 and the battery cell C5 so that discharging of the battery cell C3 and the battery cell C5 are performed at step S23.

When the discharging is completed, the process acquires the post-discharge voltage V2 at step S24. Specifically, similar to the process at step S21, the process detects the voltage at the capacitor 33 using the voltage detection circuit 21 for all of the battery cells C, thereby acquiring the detected voltage. Note that since switching timings in the discharge switches 22 fluctuate immediately after OFF command of the discharge switch 22 was issued and current might be flowing through the discharge circuits 34, a transient period is added between step S23 and step S24 (e.g. 1 to 3 milliseconds). Then, at step S25, the process measures the temperature T of the battery cell C.

Then, the process calculates the correction value ΔV for each battery cell C and corrects the post-discharge voltage V2, thereby acquiring voltage of each battery cell C. First, at step S26, the process determines whether discharging was performed for the subject battery cell C at step S23. Specifically, for the battery cell C3 and the battery cell C5, step S26 is determined as affirmative and proceeds to step S27. On the other hand, for battery cells C other than the battery cell C3 and the battery cell C5, step S26 is determined as negative, and control proceeds to step S31.

At step S27, the process acquires the initial correction value S of the battery cell C (subject battery cell C), the initial voltage Vi of the subject battery cell C acquired immediately before calculating the initial correction value S (acquired at step S11 shown in FIG. 4), and the initial temperature Ti of the subject battery cell C, the initial temperature Ti being measured when the initial voltage Vi and the initial correction value S are calculated. Specifically, for each of the battery cell C3 and the battery cell C5, the initial correction value S of the battery cell C3 or the battery cell C5, and the initial voltage Vi and the initial temperature Ti of the battery cell C3 or the battery cell C5.

At step S28, the process calculates the correction value ΔV of the subject battery cell C. The correction value ΔV refers to a difference between the actual voltage value of the battery cell C and the voltage at the capacitor 33 detected by the voltage detection circuit 21. As shown in FIG. 6, an amount of voltage drop at the connection member L is proportional to an amount of the voltage of the battery cell C. Hence, the initial correction value S is corrected based on the voltage when discharged at step S23 such that a value where the initial correction value is multiplied by the pre-discharge voltage V1, is divided by the initial voltage Vi. As shown in FIG. 7, an amount of the voltage drop at the connection member L is expressed by a linear function with respect to the temperature of the battery cell C. Specifically, since the internal resistance R of the connection member L changes with the temperature coefficient α, the process calculates a temperature difference between the initial temperature Ti of the battery cell C acquired when the initial correction value S is calculated and the temperature T of the battery cell C measured at step S25. Then, the process calculates a change rate of the internal resistance R of the connection member L. Further, the initial correction value S is multiplied by the change rate, whereby correction is made based on the temperature difference. Specifically, the change rate can be calculated from an equation $(1+(T-Ti)\times\alpha)$. In other words, a value where the initial correction value S is multiplied by the pre-discharge voltage V1, then is divided by the initial voltage Vi, and then the divided value is multiplied by the change rate of the internal resistance R caused by the temperature change. Thus, the correction value ΔV of the battery cell C3 and the battery cell C5 can be calculated.

On the other hand, at step S26, when it is determined that discharging has not been performed, the process determines whether adjacent battery cell C has discharged or not. Specifically, when the determination at step 31 is affirmative for the battery cell C2, the battery cell C4 and the battery cell C6, the process proceeds to step S32. On the other hand, when the determination at step S31 is negative for the battery cell C7 and the battery cell C8, the process proceeds to step S37. In the case where no discharging has been performed at the battery cell C and the adjacent battery cell C, since no voltage drop is produced at the connection member L, correction is not necessary. Accordingly, the correction value ΔV is set to be 0 at step S37.

At step S31, when the process determines that the discharging has performed at the adjacent battery cell C, the process determines whether the adjacent battery cell is on one side of the battery cell C. Specifically, when it is the battery cell C2 and the battery cell C6, the process determines the step S32 to be affirmative, and proceeds to step S33. Meanwhile, in the case of the battery cell C4, the process determines step S32 to be negative and proceeds to step S35.

At step S32, when it is determined that discharging has been performed on an adjacent battery cell C located adjacently on the one side of the subject battery cell C, the process acquires, at step S33, the initial correction value S of the subject battery C, the initial voltage Vi of the adjacent battery cell C (the initial voltage Vi being acquired at a time immediately before calculating the initial correction value S of the adjacent battery cell C) and the initial temperature Ti measured at a time when calculating the initial correction value S of the adjacent battery cell C. Specifically, when the battery cell C2 is the subject battery, the initial correction value S of the battery cell C2, the initial voltage Vi and the initial temperature Ti of the battery cell C3 are acquired.

Also, when the battery cell C6 is the subject battery C6, the initial correction value of the battery cell C6, the initial voltage Vi and the initial temperature of the battery cell C5 are acquired.

At step S33, the process calculates the correction value ΔV of the subject battery cell C. The correction value ΔV is calculated in the following manner. The initial correction value S of a battery cell C is multiplied by a pre-discharge voltage V1 of an adjacent battery cell C which has discharged, the multiplied value is divided by the initial voltage Vi of the adjacent battery cell C to be discharged, and the divided value is halved to be a negative value, and then the negative value is multiplied by a change rate of the internal resistance R with respect to the temperature, thereby acquiring the correction value ΔV. Specifically, for the battery cell C6, the correction value ΔV can be calculated with an equation:

$$-0.5 \times \text{the initial correction value } S \text{ of the battery cell } C6 \times \text{the pre-discharge voltage } V1 \text{ of the battery cell } C5 \div \text{the initial voltage } Vi \text{ of the battery cell } C5 \times (1+(T-Ti) \times \alpha).$$

At step S32, when the process determines that discharge has been performed from adjacent battery cells C adjacently located on the both sides of the battery cell C, the process acquires, at step S35, the initial correction value S of the battery cell C, each of the initial voltages Vi of the adjacent battery cells C acquired at a time immediately before calculating the initial correction value S of the adjacent battery cell C and each of the initial temperature Ti measured at a time when calculating the initial correction values S of the adjacent battery cells C. Specifically, when the battery cell C4 is the subject battery, the process acquires the initial correction value S of the battery cell C4, the initial voltage Vi of the battery cell C3 and the initial voltage of the battery cell C3, and the initial temperature Ti.

At step S36, the process calculates the correction value ΔV of the subject battery cell C. The correction value ΔV can be calculated in the following manner. The initial correction value S of a battery cell C is multiplied by a pre-discharge voltage V1 of an adjacent battery cell C which has been discharged and located adjacently on one side of the subject battery, the multiplied value is divided by the initial voltage Vi of the adjacent battery cell C which has been discharged, and the divided value is halved. Then, the halved value is added to a value where the initial correction value S of a battery cell C is multiplied by a pre-discharge voltage V1 of the other adjacent battery cell C which has been discharged, the multiplied value is divided by the initial voltage Vi of the other adjacent battery cell C which has been discharged and the divided value is halved, and then negative sign is added to the above summed value. The negative value is multiplied by a change rate of the internal resistance R with respect to the temperature, thereby calculating the correction value ΔV. Specifically, for the battery cell C4, the correction value ΔV can be calculated with an equation:

$$\{-0.5 \times \text{initial correction value } S \text{ of battery cell } C4 \times \text{pre-discharge voltage } V1 \text{ of battery cell } C3 \div \text{initial voltage } Vi \text{ of battery cell } C3 - 0.5 \times \text{initial correction value } S \text{ of battery cell } C4 \times \text{pre-discharge voltage } V1 \text{ of battery cell } C5 \div \text{initial voltage } Vi \text{ of battery cell } C5\} \times (1+(T-Ti) \times \alpha).$$

Then, for all of the battery cells C, after calculating the correction value ΔV, at step S29, voltage of each of battery cell C is calculated. Specifically, each correction value ΔV is added to corresponding post-discharge voltage V2 acquired at step S24, thereby calculating the voltage of each battery cell C, and the process is terminated. Thus, the post-discharge voltage V2 is detected at the voltage detection circuit 21 immediately after the discharging, and the post-discharge voltage V2 is corrected with the correction value ΔV to calculate the voltage of the battery cell C. As a result, it is not necessary to wait recovery of the voltage at the capacitor 33 so that the value of the battery cell C can be promptly calculated.

In the flowchart, function of step S25 corresponds to temperature measuring unit, and functions of steps S28, S34, S36, S37 correspond to correction value calculation unit, and function of step S29 corresponds to voltage calculation unit.

According to the above-described first embodiment, the following effects can be obtained.

According to the present embodiment, the process calculates a voltage drop at the connection member L when discharging through the discharge circuit 34, while the power supply system is operating. Then, the correction value ΔV is added to the post-discharge voltage V2, thereby calculating the voltage of the battery cell C. Thus, a voltage drop value in the connection member L, when current is actually flowing through the discharge circuit 34 is regarded as the correction value ΔV, whereby accurate correction can be performed depending on the situation. Also, since the voltage value is calculated with the correction value ΔV, it is not necessary to wait until the voltage at the capacitor 33 becomes the same as the voltage of the battery cell C so that the value of the battery cell C can be promptly calculated.

When the power supply system is activated, the process performs discharging for all of the battery cells C through the discharge circuit 34, in order to validate the discharge circuit 34 or the like. Immediately after the discharging performed in the activation of the power supply system, the process compares the post discharge voltage V0 and the initial voltage Vi detected immediately before a timing at which the post discharge voltage V0 is detected, thereby calculating the initial correction value S. Then, while the power supply system is being operated, the initial correction value S is corrected depending on the state of the battery cell C when it is discharged, thereby acquiring the correction value ΔV. By using the correction value ΔV, the post discharge voltage V2 can be corrected depending on the state of the battery cell C. As a result, the voltage value of the battery cell C can be calculated more accurately.

Since an amount of current flowing through the discharge circuit 34 is proportional to the voltage of the battery cell C immediately before the discharging through the discharge circuit 34, the voltage drop at the connection member L is also proportional to the voltage of the battery cell C. Hence, voltage difference between the voltage at the capacitor 33 and the battery cell C is proportional to the voltage of the battery cell C. In this respect, while the power supply system is being operated, in order to calculate the correction value ΔV based on the voltage drop when discharging through the discharge circuit 34, the initial correction value S is corrected, based on a ratio between the initial voltage Vi of the battery cell C used for calculating the initial correction value S and the post discharge voltage V1 immediately before discharging through the discharge circuit 34, and the corrected initial correction value S is regarded as the correction value ΔV. Thus, the initial correction value S is corrected, whereby accurate correction can be performed even when the voltage of the battery cell C varies.

In one battery cell C, when discharging through the discharge circuit 34, the initial correction value S is corrected with a pre-discharge voltage V1 of the one battery cell. Specifically, the initial correction value S is multiplied by the pre-discharge voltage V1 of the one battery cell, and the multiplied initial correction value S is divided by the initial voltage Vi when the initial correction value S is calculated, whereby the initial correction value S is corrected to acquire the correction value ΔV. Thus, the correction value ΔV is calculated so that accurate correction can be performed.

When it is assumed that one battery cell C (e.g. battery cell C6) is not discharging and the connection member L is shared by an adjacent battery cell, and an adjacent battery cell located adjacently at one side of the one battery cell (e.g. battery cell C5) is discharging through the discharge circuit 34, a voltage drop is produced in the shared connection member L. As a result, voltage at the capacitor 33 connected to the one battery cell C increases relative to the one battery cell C by an amount of the voltage drop. The voltage drop at the shared connection member L varies depending on voltage at the adjacent battery cell C so that the voltage at the capacitor 33 which is connected to the one battery cell C also varies. In this regard, the initial correction value S of the one battery cell C is corrected, based on a ratio between the pre-discharge voltage V1 at the adjacent battery cell C and the initial voltage Vi when calculating the initial correction value, to acquire the correction value ΔV. Since an amount of the voltage drop at the connection member L is only an amount corresponding to one side where the discharging is performed, the correction value ΔV becomes half amount of the initial correction value S when discharged in the both sides, and the voltage at the capacitor 33 is higher than the voltage of the one battery cell C. Hence, it is required to subtract an amount of the correction value ΔV from the amount of the voltage drop. Specifically, a value where the initial correction value S of the one battery cell C is multiplied by the pre-discharge voltage V1 of the adjacent battery cell C, is divided by the initial correction value S when calculating the initial correction value S of the adjacent battery cell C, and then the divided value is halved to be negative value, whereby the initial correction value S of the battery cell C is corrected to be the correction value ΔV. Thus, the initial correction value S is corrected, whereby accurate correction can be performed.

When it is assumed that one battery cell C is not discharging and the connection member L is shared by an adjacent battery cell, and adjacent battery cells C located adjacently at both sides of the one battery cell C are discharging through respective discharge circuits 34, the initial correction value S of the one battery cell C is corrected to acquire the correction value ΔV by using a ratio between the pre-discharge voltage V1 and the initial voltage Vi when calculating the initial correction value, in each of the adjacent battery cells C. Specifically, the initial correction value S of the one battery cell C is multiplied by the pre-discharge voltage V1 of an adjacent battery cell C located adjacently to the one battery cell in one side, the multiplied value is divided by the initial voltage Vi of the adjacent battery cell C in the one side, and the divided value is halved (one halved value). Also, the initial correction value S of the one battery cell C is multiplied by the pre-discharge voltage V1 of an adjacent battery cell C located adjacently to the one battery cell in the other side, the multiplied value is divided by the initial voltage Vi of the adjacent battery cell C in the other side, and the divided value is halved (the other halved value). Then, one halved value and the other halved value are summed to produce a negative value, whereby the initial correction value S of one battery cell C is corrected to obtain the correction value ΔV. Thus, the initial correction value S is corrected, whereby accurate correction can be performed.

The internal resistance R of the connection member L varies depending on the temperature T of the battery cell C immediately before discharging through the discharge circuit 34. Hence, the voltage drop at the connection member L varies depending on the temperature T of the battery cell C immediately before discharging through the discharge circuit 34, and an amount of discharge from the capacitor 33 also varies. In this respect, while the power supply system is being operated, in order to calculate the correction value ΔV based on the voltage drop when discharging through the discharge circuit 34, the initial correction value S is corrected, based on a difference between the initial temperature Ti of the battery cell C used for calculating the initial correction value S and the temperature T when discharging through the discharge circuit 34, and the corrected initial correction value S is regarded as the correction value ΔV. Thus, the initial correction value S is corrected, whereby accurate correction can be performed even when the temperature of the battery cell C varies.

Other Embodiments

The present disclosure is not limited to the above-described embodiment. For example, embodiment may be modified in the following manner.

According to the above-described embodiment, after discharging the battery cell C of the odd numbered group through the discharge circuit 34, voltage detection is performed twice, and then the battery cell C of the even numbered group is discharged through the discharge circuit 34. However, after detecting the post-discharge voltage V2 of a group of one battery cell C, second voltage detection is not performed and batteries of other group may be discharged. For example, battery cell C of even numbered group may be discharged immediately after the detection timing of the post-discharge voltage V2 of the battery cell C of the odd numbered group.

According to the above-described embodiment, correction is made based on voltage ratio and the temperature difference when the initial correction value S is calculated and when the battery cell C is discharged. However, correction may be made without voltage but may be performed with the temperature, or correction may be made without temperature but the correction may be made with voltage.

According to the above-described embodiment, the initial correction value S is calculated when the power supply system is activated. However, the timing of calculating the initial correction value is not limited thereto, but may be any timing as long as discharge is performed for all of the battery cells.

What is claimed is:

1. A battery control unit for a power supply system, the power supply system having: a storage battery in which a plurality of battery cells are connected in series, a filter circuit provided for each of the battery cells including a capacitor and eliminating noise included in voltage transmitted from that battery cell, a connection member that connects between each battery cell and the respective filter circuit, and a discharge circuit including a discharge switch provided for each of the battery cells and connected in series to the battery cell via the connection member and a discharge resistor, the battery control unit comprising:

a voltage detection unit provided for each of the battery cells, configured to detect voltage at the respective battery cell where noise is eliminated by the respective filter circuit, the voltage being detected immediately before or after discharging is performed through the discharge circuit;

an initial correction value calculation unit configured to calculate an initial correction value when the power supply system is activated and when discharging has been performed for all of the battery cells through the discharge circuit, the initial correction value being calculated by comparing voltage detected at a previous or next detection timing of the post-discharge voltage detected by each voltage detection unit, with the post-discharge voltage;

a correction value calculation unit configured to:
  calculate, while the power supply system is being operated, an amount of a voltage drop at the connection member when discharging is performed through the discharge circuit, to be a correction value; and
  correct, during the power supply system being operated, the initial correction value calculated by the initial correction value calculation unit to be the correction value, depending on a state of each battery cell when being discharged through the discharge circuit; and a voltage calculation unit configured to calculate voltage of each battery cell by adding the correction value calculated by the correction value calculation unit to a post-discharge voltage detected by the respective voltage detection unit, the post-discharge voltage being voltage detected immediately after the discharging.

2. The battery control unit according to claim 1, wherein the correction value calculation unit is configured to correct the initial correction value to be the correction value, based on a ratio between a pre-discharge voltage of each battery cell detected by the respective voltage detection unit when the initial correction value calculation unit calculates the initial correction value, and the pre-discharge voltage of that battery cell detected by the voltage detection unit immediately before discharging is performed through the discharge circuit during the power supply system being operated.

3. The battery control unit according to claim 1, wherein the correction value calculation unit is configured to correct the correction value to be the correction value such that the initial correction value of one battery cell is multiplied by the pre-discharge voltage immediately before discharging one battery cell, and the multiplied initial correction value is divided by the pre-discharge voltage at a time when calculating the correction value of one battery cell, thereby correcting the correction value.

4. The battery control unit according to claim 1, wherein the connection member is shared by battery cells adjacently located to each other, and the correction calculation unit is configured to correct the initial correction value to be the correction value when the one battery cell does not discharge but the battery cell located adjacently to one side of the one battery cell discharges, such that a value where the initial correction value of the one battery cell is multiplied by a pre-discharge voltage immediately before discharging the adjacent battery cell is divided by a pre-discharge voltage at a time when the initial correction value of the adjacent battery cell is calculated, and the divided value is halved to produce a negative value, thereby correcting the initial correction value to be the correction value.

5. The battery control unit according to claim 1, wherein the connection member is shared by battery cells adjacently located to each other, the correction calculation unit is configured to correct the initial correction value to be the correction value when the one battery cell does not discharge but both battery cells located adjacently to the one battery cell discharge, such that a value where the initial correction value of the one battery cell is multiplied by a pre-discharge voltage immediately before discharging the adjacent battery cell of one side, is divided by a pre-discharge voltage at a time when the initial correction value of the adjacent battery cell of the one side and the divided value is halved to be a first value, and a value where the initial correction value of the one battery cell is multiplied by a pre-discharge voltage immediately before discharging the adjacent battery cell of the other side, is divided by a pre-discharge voltage at a time when the initial correction value of the adjacent battery cell of the other side and the divided value is halved to be a second value, the first value and the second value are added to be a negative value, thereby correcting the initial correction value to be the correction value.

6. The battery control unit according to claim 1, wherein the correction value calculation unit includes a temperature measuring unit that measures a temperature of the battery cells, and the correction calculation unit is configured to correct the initial correction value to be the correction value based on a difference between a temperature measured by the temperature measuring unit at a time when the initial correction value is corrected and a temperature measured by the temperature measuring unit at a time when discharging is performed through the discharge circuit when the power supply system is being operated.

* * * * *